(12) United States Patent
Hwang et al.

(10) Patent No.: US 7,452,806 B2
(45) Date of Patent: Nov. 18, 2008

(54) METHOD OF FORMING INDUCTOR IN SEMICONDUCTOR DEVICE

(75) Inventors: Sang Il Hwang, Wonju-si (KR); Suk Won Jung, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/882,047

(22) Filed: Jul. 30, 2007

(65) Prior Publication Data

US 2008/0026588 A1    Jan. 31, 2008

(30) Foreign Application Priority Data

Jul. 31, 2006    (KR) ........................ 10-2006-0072041

(51) Int. Cl.
*H01L 21/4763* (2006.01)
(52) U.S. Cl. ............... 438/637; 438/700; 257/E21.022; 257/E21.579
(58) Field of Classification Search ................. 438/624, 438/634, 637, 700, 736, 740
See application file for complete search history.

(56) References Cited

U.S. PATENT DOCUMENTS 7,153,766 B2 * 12/2006 Zhang et al. ................ 438/627

* cited by examiner

*Primary Examiner*—Quoc D Hoang
(74) *Attorney, Agent, or Firm*—Finnegan, Henderson, Farabow, Garrett & Dunner, L.L.P.

(57) ABSTRACT

Disclosed herein is a method of forming an inductor in a semiconductor device, the method including forming an etching-prevention film, a first interlayer insulating film, and a first hard mask film over a silicon semiconductor substrate in this sequence; selectively etching the first hard mask film to form a hole; forming a second interlayer insulating film over the first hard mask film; forming a second hard mask film over the second interlayer insulating film; forming a photoresist pattern having a trench forming opening over the second hard mask film; removing a part of the second hard mask film and a part of the second interlayer insulating film by using the photoresist pattern as an etching mask, to form a first trench in the second interlayer insulating film; removing the photoresist pattern and polymers produced in the first trench by ashing and cleaning process; etching the second interlayer insulating film by using the second hard mask film as an etching mask until the first hard mask film is exposed to form a second trench in the second interlayer insulating film, and subsequently, etching the first interlayer insulating film by using both the first hard mask film and the second hard mask film as etching masks until the etching-prevention film is exposed, to form a hole in the first interlayer insulating film; and removing polymers produced in the second trench and the second hole by ashing and cleaning processes.

5 Claims, 6 Drawing Sheets

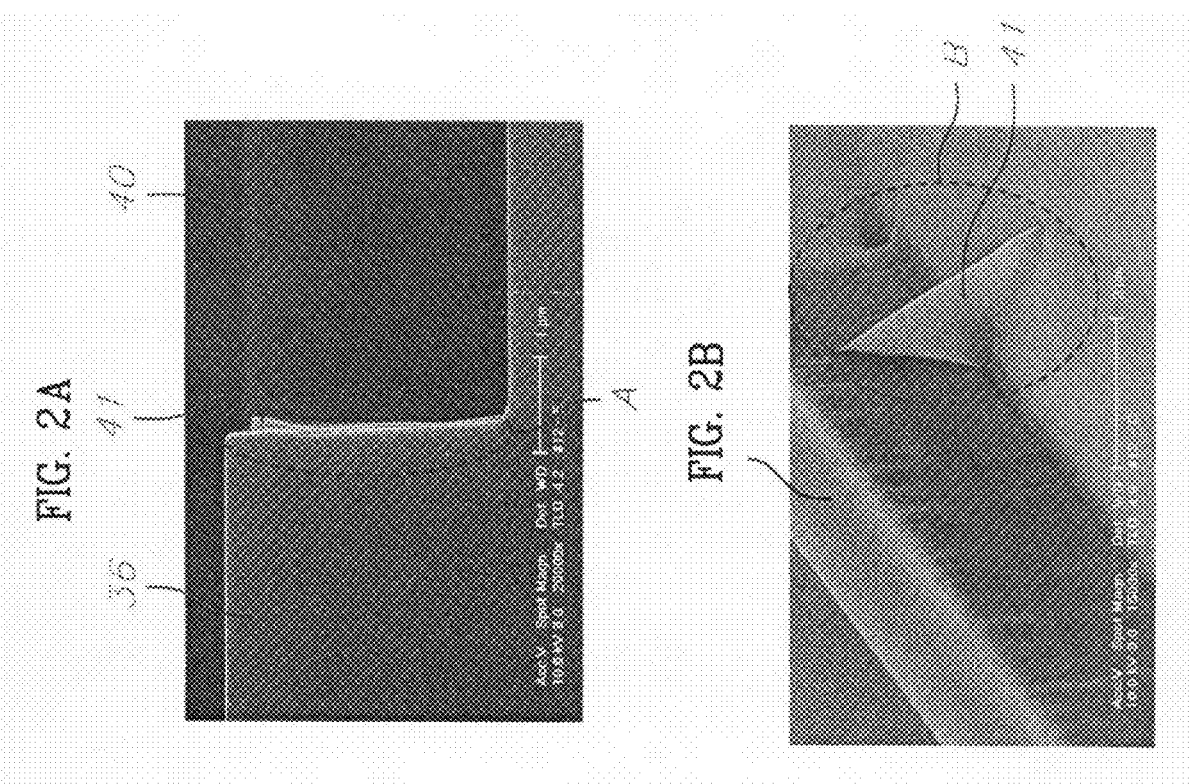

METHOD OF FORMING INDUCTOR IN SEMICONDUCTOR DEVICE

RELATED APPLICATION

The application is based upon and claims the benefit of priority to Korean Patent Application No. 10-2006-0072041, filed on Jul. 31, 2006, the entire contents of which are incorporated herein by reference.

DESCRIPTION OF THE INVENTION

1. Field of the Invention

The present invention relates to a method of forming an inductor in a semiconductor device. In particular, the present invention relates to a method of forming an inductor in a semiconductor device, which can efficiently remove polymers produced during etching of an interlayer insulating film used to form the inductor.

2. Background of the Invention

A complementary metal-oxide semiconductor (CMOS) device for a high-frequency circuit includes an inductor as a passive device integrated on a silicon substrate. However, in the course of forming the inductor, there occurs undesired parasitic resistance and parasitic capacity, etc., resulting in lowering a characteristic coefficient (Q) that is the main characteristic factor of a spiral inductor. Conventionally, copper, having a superior electric conductivity, has been used to achieve a higher Q factor. In particular, copper has been used to provide a thicker inductor metal film for achieving a lower parasitic resistance.

In the case where an inductor is made of copper, the inductor is subjected to a damascene process. In a damascene process, after an interlayer insulating film is etched to form a so-called damascene structure, copper is buried in the damascene structure by a chemical vapor deposition or an electroplating method. In particular, a dual damascene structure includes a hole to allow an electric connection with a lower metal wiring, and a trench in which an inductor body will be formed.

In the formation of a copper inductor using a dual damascene process, a trench, in which an inductor metal will be buried, must have a deeper depth, to achieve a higher Q factor of the inductor. A process for forming a deep trench is called an "ultra-thick-metal (UTM) etching process". Since the UTM etching process generally forms a trench having a depth of 3 μm or more, it requires an excessively long etching process time and causes a great amount of byproduct due to the reaction of an etching process gas. The byproduct generally includes polymers, and is adhered to the inner sidewall of an interlayer insulating film in which the trench is formed. Once the byproduct is adhered to the interlayer insulating film, it is very difficult to remove the byproduct by a general wet-cleaning process.

Now, a conventional UTM etching process will be described with reference to FIGS. 1A to 1E.

First, as shown in FIG. 1A, an etching-prevention film 24, a first interlayer insulating film 26, and a hard mask film 28 are sequentially formed over a silicon substrate 22 having a predetermined lower metal wiring (not shown). In this case, the etching-prevention film 24 and the hard mask film 28 may be made of a silicon nitride (SiN) film, and the first interlayer insulating film 26 may be made of an oxide film.

Subsequently, a first photoresist pattern 31 is formed over the hard mask film 28. The first photoresist pattern 31 is used to form a hole, and may be formed by applying a photoresist material onto the hard mask film 28 and performing a photography process on the applied photoresist material.

By using the first photoresist pattern 31 as an etching mask, the hard mask film 28 is selectively etched to form a hard mask film pattern 28a including an opening region as shown in FIG. 1B. A part of the first interlayer insulating film 26 is exposed through the hard mask film pattern 28a.

Next, the first photoresist pattern 31 is removed, and as shown in FIG. 1C, a second interlayer insulating film 36 is formed over the hard mask film pattern 28a. The second interlayer insulating film 36 is a layer in which an inductor metal will be buried, and has a thickness of approximately 3 μm or more. The second interlayer insulating film 36 is formed over the exposed part of the first interlayer insulating film 26 as well as the hard mask film pattern 28a.

A second photoresist pattern 33 is formed over the second interlayer insulating film 36 as shown in FIG. 1D. The second photoresist pattern 33 is used to form a trench, and may be prepared by applying a photoresist material over the second interlayer insulating film 36, and performing a photography process on the applied photoresist material. In particular, an opening region of the second photoresist pattern 33 is preferably configured to include the opening region of the hard mask film pattern 28a.

Thereafter, the second interlayer insulating film 36 is selectively etched by using the second photoresist pattern 33 as an etching mask, to form a trench 40 as shown in FIG. 1E. With the formation of the trench 40, a surface of the hard mask film pattern 28a is exposed. Then, by etching the first interlayer insulating film 26 subsequent to the etching for the trench 40, a hole 50 is formed. In the etching of the first interlayer insulating film 26 to form the hole 50, the hard mask film pattern 28a, which is exposed after the formation of the trench 40, is used as an etching mask. The etching of the first interlayer insulating film 26 is continued until a surface of the etching-prevention film 24 is exposed.

Meanwhile, during the processes of forming the trench 40 and the hole 50, and more particularly, during the processes of etching the thick second interlayer insulating film 36 and the first interlayer insulating film 26, great amounts of polymers 41 are produced as shown in FIG. 1E.

FIGS. 2A and 2B illustrate images captured by a scanning electron microscope (SEM), illustrating the cross section of the substrate after forming the trench 40. It can be observed from the drawings that great amounts of polymers 41 are produced during the etching processes. More particularly, FIG. 2A illustrates an image captured right after forming the trench 40, and it can be seen from the dashed ellipse A of FIG. 2A that the polymers 41 are adhered to the inner sidewall of the interlayer insulating film 36. Conventionally, ashing and cleaning processes have been used to remove the polymers 41 remaining on the inner sidewall of the interlayer insulating film 36. However, in the case of polymers produced during the UTM etching process, they are accumulated in great amount for a long process time, and cannot be easily removed by general ashing and cleaning processes. For reference, FIG. 2B illustrates a state wherein the polymers 41, adhered to the inner sidewall of the interlayer insulating film, are lifted from the inner sidewall after having passed through ashing and cleaning processes (See the dashed ellipse B).

The polymers, which remain on the interlayer insulating film without being removed, disturb the adsorption of an inductor metal while the inductor metal is buried in the trench, and can cause a contact defect between the metal and a wiring. Moreover, as shown in FIG. 2B, if the polymers are incompletely removed and peeled off in a subsequent process, they may be a pollutant of a process chamber, or may cause an unexpected defect when they fall on any region of the semiconductor substrate.

SUMMARY OF THE INVENTION

Accordingly, the present invention is directed to a method of forming an inductor in a semiconductor device that substantially obviates one or more problems due to limitations and disadvantages of the related art.

An object of the present invention is to provide a method of forming an inductor in a semiconductor device, which can efficiently remove great amounts of polymers produced during an UTM etching process.

Additional advantages, objects, and features of the invention will be set forth in part in the detailed description which follows and in part will become apparent to those having ordinary skill in the art upon examination of the following or may be learned from practice of the invention. The objectives and other advantages of the invention may be realized and attained by the structure particularly pointed out in the written description and claims herein as well as in the appended drawings.

To achieve these objects and other advantages and in accordance with the purpose of the invention, as embodied and broadly described herein, a method of forming an inductor in a semiconductor device comprises: forming an etching-prevention film, a first interlayer insulating film, and a first hard mask film over a silicon semiconductor substrate in this sequence; selectively etching the first hard mask film to form a hole; forming a second interlayer insulating film over the first hard mask film; forming a second hard mask film over the second interlayer insulating film; forming a photoresist pattern having a trench forming opening over the second hard mask film; removing a part of the second hard mask film and a part of the second interlayer insulating film by using the photoresist pattern as an etching mask to form a first trench in the second interlayer insulating film; removing the photoresist pattern and polymers produced in the first trench by ashing and cleaning processes; etching the second interlayer insulating film by using the second hard mask film as an etching mask until the first hard mask film is exposed to form a second trench in the second interlayer insulating film, and subsequently, etching the first interlayer insulating film by using both the first hard mask film and the second hard mask film as etching masks until the etching-prevention film is exposed to form a hole in the first interlayer insulating film; and removing polymers produced in the second trench and the hole by ashing and cleaning processes.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principles of the invention. In the drawings:

FIGS. 2A and 2B are images captured by a scanning electron microscope, illustrating polymers produced in a damascene structure that is formed in an interlayer insulating film, according to one exemplary embodiment.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or like parts.

Hereinafter, a method of forming an inductor in a semiconductor device according an exemplary embodiment of the present invention will be described with reference to the accompanying drawings.

FIGS. 3A to 3E are sectional views illustrating a method of forming an inductor in a semiconductor device according to the present invention.

Figure 1A:
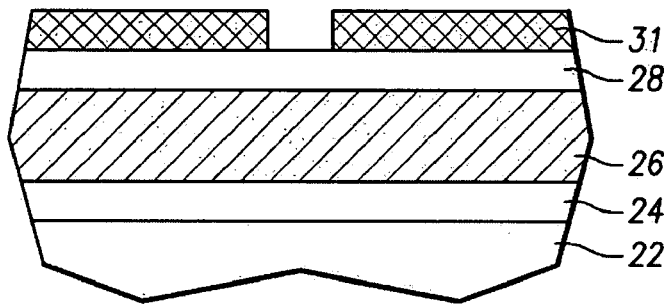
FIGS. 1A to 1E are sectional views illustrating a conventional ultra-thick-metal (UTM) etching process, according to one exemplary embodiment.
Figure 1B:
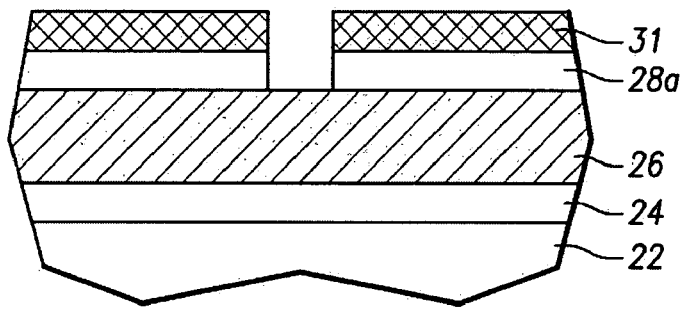
Figure 1C:
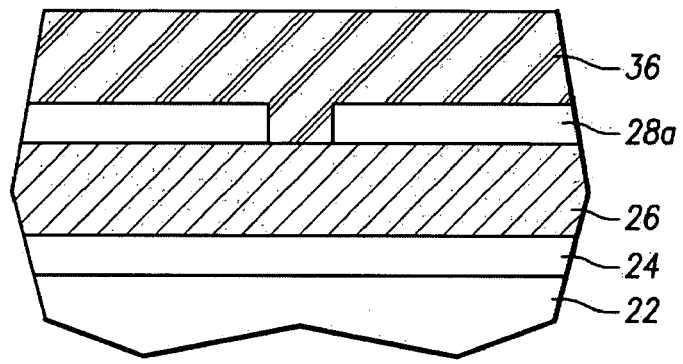
Figure 1D:
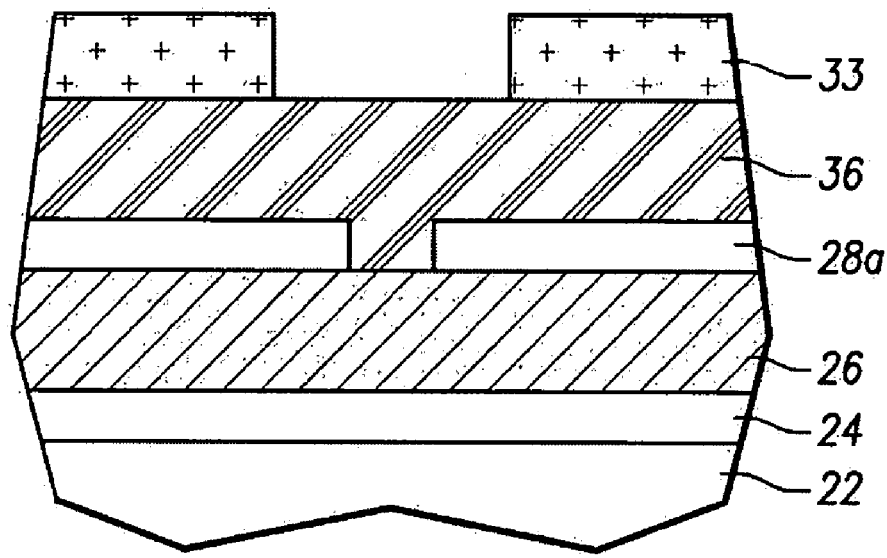
Figure 1E:
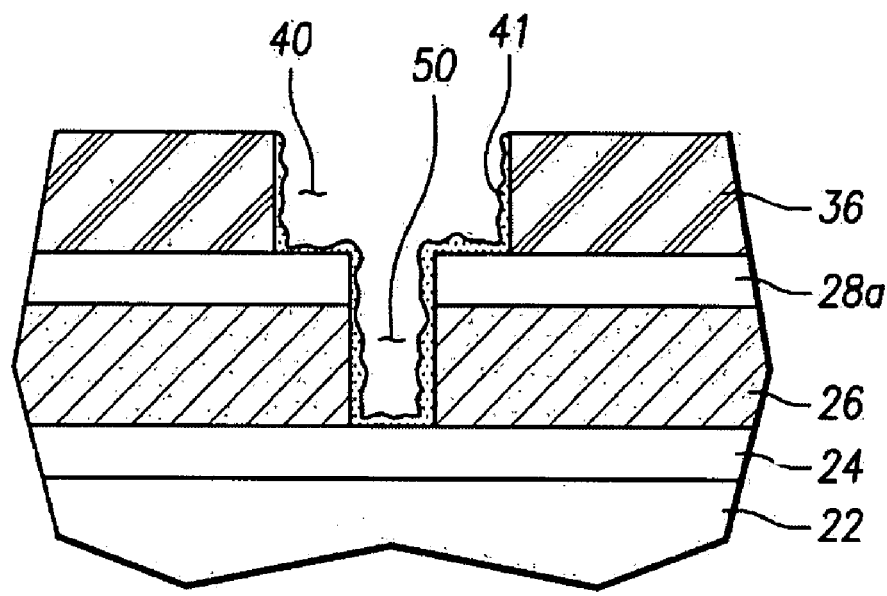
Figure 3A:
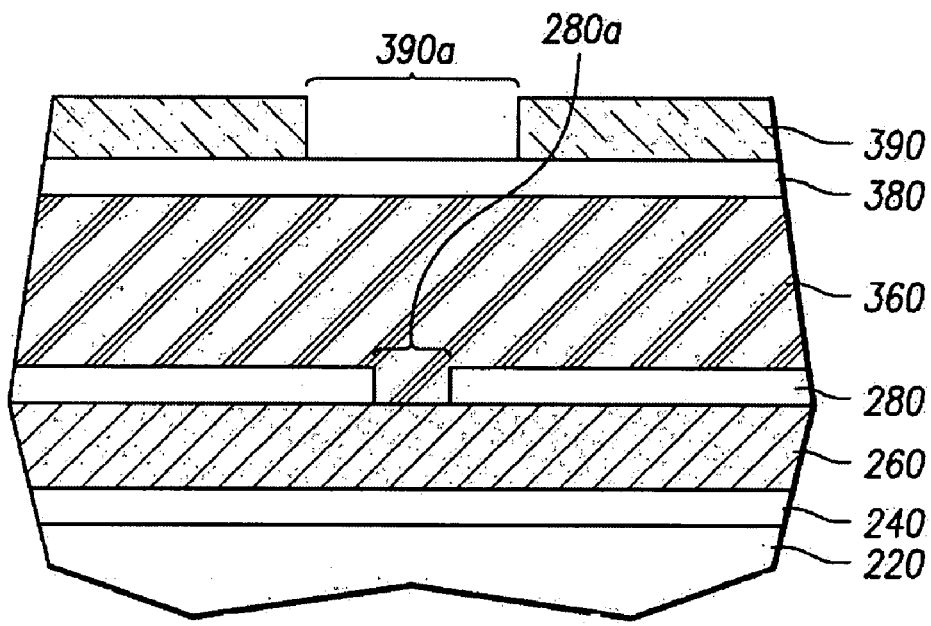
FIGS. 3A to 3E are sectional views illustrating an UTM etching process of the present invention according to one exemplary embodiment.

As shown in FIG. 3A, an etching-prevention film 240, a first interlayer insulating film 260, a first hard mask film 280 having a hole 280a, and a second interlayer insulating film 360 can be sequentially formed over a silicon semiconductor substrate 220, which can be formed with predetermined semiconductor circuit devices (for example, transistors, multi-layered metal wiring, etc.). The formation of the above constituent films is similar to the prior art as shown in FIGS. 1A to 1C, and a detailed description thereof will be omitted.

A second hard mask film 380 can be formed over the resulting structure having the above described constituent films, and more particularly, over the second interlayer insulating film 360. In turn, a predetermined photoresist pattern 390 having a trench forming opening 390a is formed over the second hard mask film 380. Here, the trench forming opening 390a has a width larger than that of the hole 280a formed in the first hard mask film 280.

Figure 3B:
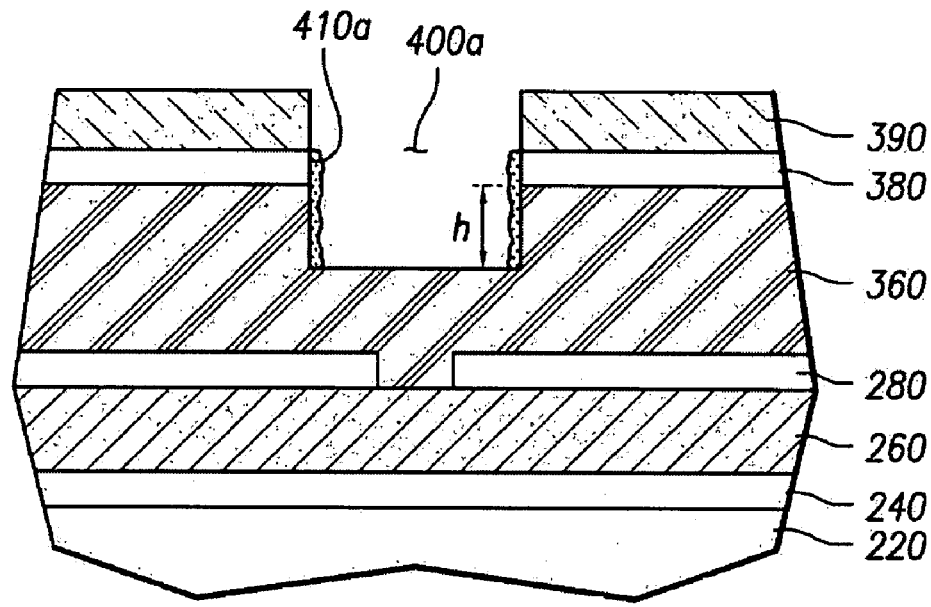

As shown in FIG. 3B, the second hard mask film 380 and the second interlayer insulating film 360 can be sequentially etched by using the photoresist pattern 390 as an etching mask. Thereby, a first trench 400a is formed in the second interlayer insulating film 360. Preferably, when the first trench 400a has a depth h, the depth h is approximately half of the thickness of the second interlayer insulating film 360. During the etching process for forming the first trench 400a, polymers 410a may be produced at the inner wall of the first trench 400a, i.e. at the inner sidewall of the exposed second interlayer insulating film 360. However, since time spent on the etching process for forming the first trench 400a is only approximately half that of the prior art, the amount of polymers produced is only approximately half that of the prior art. More specifically, when the UTM etching process is performed such that the second interlayer insulating film 360 has a thickness of approximately 3 μm, the polymers generated when forming the first trench 400a having a depth of approximately 1.5 μm, can be sufficiently removed by a general ashing process using $O_2$ plasma and a wet-cleaning process. Accordingly, the ashing and cleaning processes are performed right after forming the first trench 400a, so as to completely remove the polymers 410a.

Figure 3C:
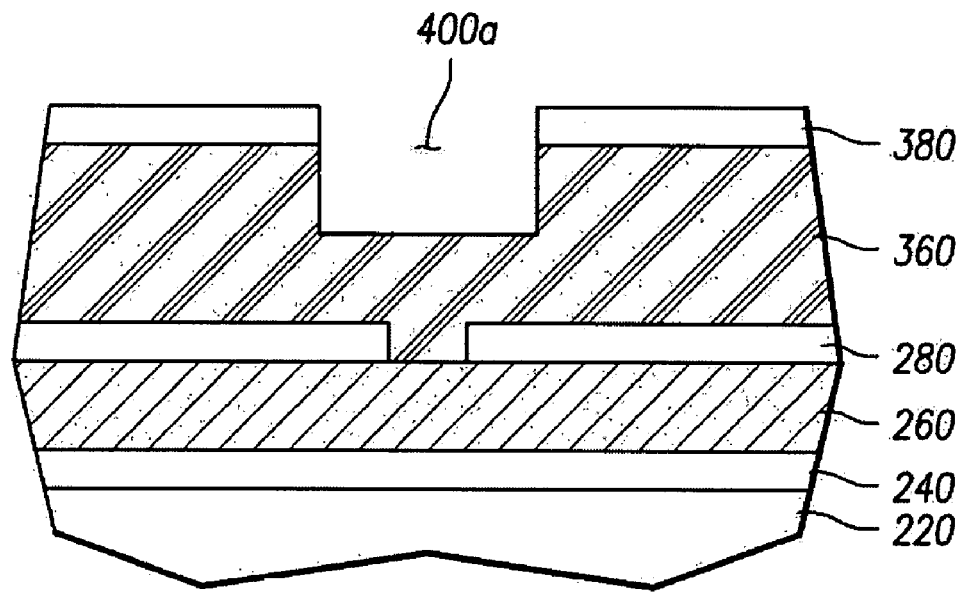

Since the $O_2$ plasma ashing process and the wet-cleaning process can be employed to remove the polymers 410a, as shown in FIG. 3C, the photoresist pattern 390 can be removed simultaneously with the removal of the polymers 410a. Therefore, it is necessary to form an additional etching mask, in order to achieve a desired dual damascene structure in the second interlayer insulating film 360. However, when a photoresist pattern is again formed over the second interlayer insulating film 360 to obtain the additional etching mask, there can occur a mask alignment error, thereby making it difficult to form the photoresist pattern such that an opening of the photoresist pattern is accurately overlapped with the first trench 400a. In consideration of the above problem, according to the present invention, the second hard mask film 380 is formed over the second interlayer insulating film 360, so as to be utilized as an etching mask.

Figure 3D:
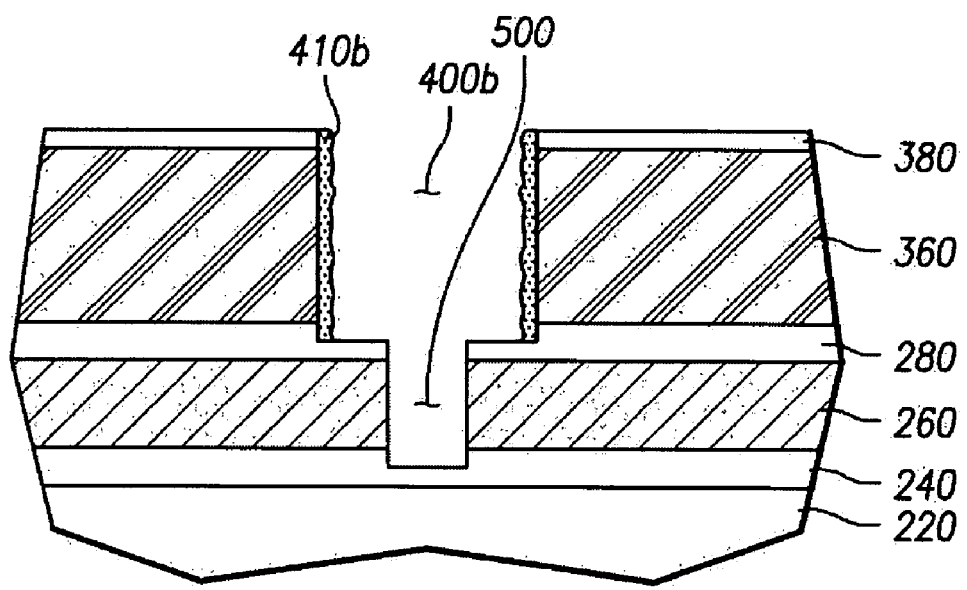

By using the second hard mask film 380 as an etching mask, an exposed region of the second interlayer insulating film 360 can be etched until the first hard mask film 280 is exposed, to form the second trench 400b as shown in FIG. 3D. Subsequent to the etching process for forming the second trench 400b, a part of the first interlayer insulating film 260, which is exposed through the hole 280a formed in the first hard mask film 280, can be etched, to form a second hole 500. In the etching process for forming the second hole 500, the first hard mask film 280 and the second hard mask film 380 can be used as etching masks. In other words, during the etching process for forming the hole 500, the second interlayer insulating film 360 can be protected by the second hard mask film 380.

In particular, in the etching processes for forming the second trench 400b and the second hole 500, it is preferable to use an etching recipe having a large etching selectivity of the first and second interlayer insulating films 260, 360 to the first and second hard mask films 280, 380. For this, the first and second hard mask films 280, 380 are preferably made of a silicone nitride film, and the first and second interlayer insulating films 260, 360 are preferably made of a silicon oxide film. When the etching selectivity of a silicon oxide film to a silicon nitride film defines a value of a, the etching recipe is set such that the value a (i.e. the etching rate of a silicon oxide film/the etching rate of a silicon nitride film) is preferably larger than 1, and more preferably, is at least 10 or more.

Meanwhile, even if the etching rate of the first and second hard mask films 280, 380 is smaller than the etching rate of the first and second interlayer insulating films 260, 360, the hard mask films 280, 380 may be etched simultaneously with the etching of the interlayer insulating films 260, 360. Therefore, there is a risk of damage to the interlayer insulating films 260, 360 during the etching processes so long as the hard mask films 280, 380 are not formed with appropriate thicknesses. Accordingly, when the first interlayer insulating film 260 has a thickness T1, the second interlayer insulating film 360 has a thickness T2, the first trench 400a has a depth h, the first hard mask film 280 has a thickness t1, and the second hard mask film 380 has a thickness t2, preferably, the thickness t1 is at least a value of T1/a or more, and the thickness t2 is at least a value of (T2−h+T1)/a or more.

Figure 3E:
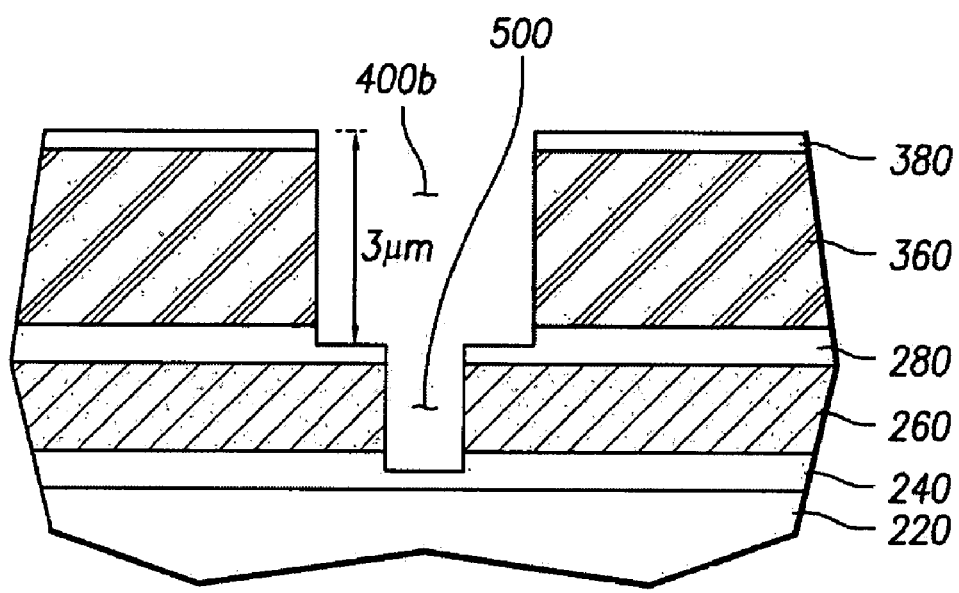

Even during the etching processes for forming the second trench 400b and the second hole 500, polymers 410a may be produced, and the produced polymers 410b may be adhered to the exposed inner sidewall of the second interlayer insulating film 360 or the first interlayer insulating film 260. Thus, an ashing process using $O_2$ plasma and/or a wet-cleaning process can be performed to completely remove the polymers 410b. Here, since an etching process time of the interlayer insulating films is shortened as compared to the prior art, there exists only the amount of the polymers 410b to be completely removed by general ashing and cleaning processes. FIG. 3E illustrates a completely removed state of the polymers 410b after performing ashing and cleaning processes.

Thereafter, a part of the etching-prevention film 240, which is exposed through the second hole 500, can be selectively removed, and a conductive material, i.e. copper, is buried in the second hole 500 and the trench 400b, to finally complete an inductor.

As apparent from the above description, with the inductor forming method according to the present invention, poly- mers, which are produced in the course of forming a trench during an UTM etching process, can be efficiently removed even by using general ashing and wet-cleaning processes. As a result, the present invention can have the effect of eliminating any process defects (for example, a contact defect of metal, pollution of a process chamber in a subsequent process, etc.) caused by the residual polymers and the lifting of the residual polymers.

It will be apparent to those skilled in the art that various modifications and variations may be made in the present invention without departing from the spirit and scope consistent with the invention as defined by the appended claims.

What is claimed is:

1. A method of forming an inductor in a semiconductor device, the method comprising:

forming an etching-prevention film, a first interlayer insulating film, and a first hard mask film over a silicon semiconductor substrate in this sequence;

selectively etching the first hard mask film to form a hole;

forming a second interlayer insulating film over the first hard mask film;

forming a second hard mask film over the second interlayer insulating film;

forming a photoresist pattern having a trench forming opening over the second hard mask film;

removing a part of the second hard mask film and a part of the second interlayer insulating film by using the photoresist pattern as an etching mask, to form a first trench in the second interlayer insulating film;

removing the photoresist pattern and polymers produced in the first trench;

etching the second interlayer insulating film by using the second hard mask film as an etching mask until the first hard mask film is exposed, to form a second trench in the second interlayer insulating film, and subsequently, etching the first interlayer insulating film by using both the first hard mask film and the second hard mask film as etching masks until the etching-prevention film is exposed, to form a hole in the first interlayer insulating film; and removing polymers produced in the second trench and the second hole 2. The method according to claim 1, wherein the second interlayer insulating film has a thickness of 3 µm or more.

3. The method according to claim 1, wherein the first hard mask film and the second hard mask film are made of a silicon nitride film, and the first interlayer insulating film and the second interlayer insulating film are made of a silicon oxide film.

4. The method according to claim 3, wherein the etching of the second interlayer insulating film and the first interlayer insulating film uses an etching recipe in which an etching selectivity of a silicon oxide film to a silicon nitride film has a value of a, and the value a is at least 10 or more.

5. The method according to claim 4, wherein, when the first interlayer insulating film has a thickness T1, the second interlayer insulating film has a thickness T2, the first trench has a depth h, the first hard mask film has a thickness t1, and the second hard mask film has a thickness t2, the thickness t1 is at least a value of T1/a or more, and the thickness t2 is at least a value of (T2−h+T1)/a or more.

* * * * *